United States Patent
Wang et al.

(10) Patent No.: US 9,253,887 B2
(45) Date of Patent: Feb. 2, 2016

(54) FABRICATION METHOD OF EMBEDDED CHIP SUBSTRATE

(75) Inventors: Yung-Hui Wang, Kaohsiung (TW); Ying-Te Ou, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 718 days.

(21) Appl. No.: 13/564,421

(22) Filed: Aug. 1, 2012

(65) Prior Publication Data

US 2012/0295403 A1   Nov. 22, 2012

Related U.S. Application Data

(62) Division of application No. 12/500,841, filed on Jul. 10, 2009, now abandoned.

(30) Foreign Application Priority Data

Jul. 22, 2008   (TW) .............................. 97127864 A (51) Int. Cl.
| | |
|---|---|
| *H01L 21/50* | (2006.01) |
| *H05K 1/18* | (2006.01) |
| *H01L 23/538* | (2006.01) |
| *H01L 23/00* | (2006.01) |

(Continued)

(52) U.S. Cl.
CPC ............ *H05K 1/185* (2013.01); *H01L 23/5389* (2013.01); *H01L 24/24* (2013.01); *H01L 24/82* (2013.01); *H05K 1/188* (2013.01); *H01L 2224/04105* (2013.01); *H01L 2224/24227* (2013.01); *H01L 2224/32225* (2013.01); *H01L 2224/73267* (2013.01); *H01L 2224/92244* (2013.01); *H01L 2924/014* (2013.01); *H01L 2924/01005* (2013.01); *H01L 2924/01029* (2013.01); *H01L 2924/01033* (2013.01);

(Continued)

(58) Field of Classification Search
None
See application file for complete search history.

(56) References Cited

U.S. PATENT DOCUMENTS

| | | | |
|---|---|---|---|
| 5,432,677 | A | 7/1995 | Mowatt et al. |
| 6,309,912 | B1 | 10/2001 | Chiou et al. |

(Continued)

FOREIGN PATENT DOCUMENTS

| | | |
|---|---|---|
| CN | 1466777 | 1/2004 |
| TW | 200731888 | 8/2007 |

OTHER PUBLICATIONS

Final Office Action on U.S. Appl. No. 12/500,841 dated May 3, 2012, 14 pages.

(Continued)

*Primary Examiner* — Seahvosh Nikmanesh
(74) *Attorney, Agent, or Firm* — Foley & Lardner LLP; Cliff Z. Liu; Angela D. Murch (57) ABSTRACT

An embedded chip substrate includes a first insulation layer, a core layer, a chip, a second insulation layer, a first circuit layer, and a second circuit layer. The core layer disposed on the first insulation layer has an opening that exposes a portion of the first insulation layer. The chip is adhered into a recess constructed by the opening and the first insulation layer. The second insulation layer is disposed on the core layer for covering the chip. The first circuit layer is disposed at the outer side of the first insulation layer located between the first circuit layer and the core layer. The second circuit layer is disposed at the outer side of the second insulation layer located between the second circuit layer and the core layer. The first circuit layer is electrically connected to the second circuit layer that is electrically connected to the chip.

7 Claims, 11 Drawing Sheets

(51) Int. Cl.
 *H05K 3/42* (2006.01)
 *H05K 3/46* (2006.01)

(52) U.S. Cl.
 CPC .............. *H01L2924/01079* (2013.01); *H01L 2924/1517* (2013.01); *H01L 2924/15153* (2013.01); *H05K 3/429* (2013.01); *H05K 3/4602* (2013.01); *H05K 3/4652* (2013.01); *H05K 2201/09536* (2013.01); *H05K 2201/10674* (2013.01); *H05K 2203/063* (2013.01); *Y10T 29/4913* (2015.01); *Y10T 29/49204* (2015.01); *Y10T 29/49213* (2015.01)

(56) References Cited

U.S. PATENT DOCUMENTS

| | | | |
|---|---|---|---|
| 6,709,898 B1 | 3/2004 | Ma et al. | |
| 6,909,054 B2 * | 6/2005 | Sakamoto | H01L 21/4846 174/260 |
| 7,842,887 B2 * | 11/2010 | Sakamoto | H01L 21/4846 174/260 |
| 2005/0157478 A1 | 7/2005 | Inagaki et al. | |
| 2005/0230835 A1 | 10/2005 | Sunohara et al. | |
| 2005/0255303 A1 * | 11/2005 | Sawatari et al. | 428/209 |
| 2006/0145328 A1 | 7/2006 | Hsu | |
| 2007/0287281 A1 | 12/2007 | Wang et al. | |

OTHER PUBLICATIONS

Non-Final Office Action on U.S. Appl. No. 12/500,841 dated Nov. 22, 2011, 13 pages.

Second Office Action of China Counterpart Application issued on Mar. 7, 2012, p. 1-p. 4.

\* cited by examiner

FIG. 5

FABRICATION METHOD OF EMBEDDED CHIP SUBSTRATE

CROSS-REFERENCE TO RELATED APPLICATION

This application is a divisional application of and claims the priority benefit of a prior application Ser. No. 12/500,841, filed on Jul. 10, 2009, now pending, which claims the priority benefit of Taiwan application serial no. 97127864, filed on Jul. 22, 2008. The entirety of each of the above-mentioned patent applications is hereby incorporated by reference herein and made a part of this specification.

BACKGROUND OF THE INVENTION

1. Field of the Invention

The present invention generally relates to a fabrication method of a substrate. More particularly, the present invention relates to a fabrication method of an embedded chip substrate.

2. Description of Related Art

With recent progress of electronic technologies, electronic products that are more user-friendly and with better functions are continuously developed. Further, these products are designed to satisfy requirements for lightness, slimness, shortness, and compactness. In a housing of the electronic product, a circuit board is often disposed for carrying various electronic elements. The electronic elements occupy the carrying area on the circuit board. Hence, when the number of the electronic elements increases, the carrying area on the circuit board is required to be extended. As such, the area occupied by the circuit board is inevitably increased as well, which deteriorates miniaturization of the electronic products. In addition, the circuit boards used in chip packages also encounter the similar issue.

SUMMARY OF THE INVENTION

The present invention further provides a fabrication method of an embedded chip substrate. A chip in the embedded chip substrate formed by conducting said fabrication method does not occupy a carrying area of a circuit board.

In the present invention, a fabrication method of an embedded chip substrate is provided hereinafter. First, a core layer that has an opening is provided. Next, a first insulation layer and a first conductive layer are provided. The first conductive layer is disposed on the first insulation layer. The core layer is then disposed on the first insulation layer that is located between the core layer and the first conductive layer. After that, a chip is adhered into a recess formed by the opening and the first insulation layer. Thereafter, a second insulation layer and a second conductive layer are provided. The second conductive layer is disposed on the second insulation layer. The second insulation layer is then disposed on the core layer. The second insulation layer is located between the core layer and the second conductive layer and covers the recess. Afterwards, the first conductive layer, the first insulation layer, the core layer, the second insulation layer, and the second conductive layer are laminated. Next, the first conductive layer and the second conductive layer are respectively patterned, so as to form a first circuit layer and a second circuit layer. The first circuit layer is electrically connected to the second circuit layer, and the second circuit layer is electrically connected to the chip.

In light of the foregoing, the chip is embedded into the circuit board according to the present invention, and therefore the chip does not occupy the carrying area of the circuit board.

In order to make the above and other features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 2A:
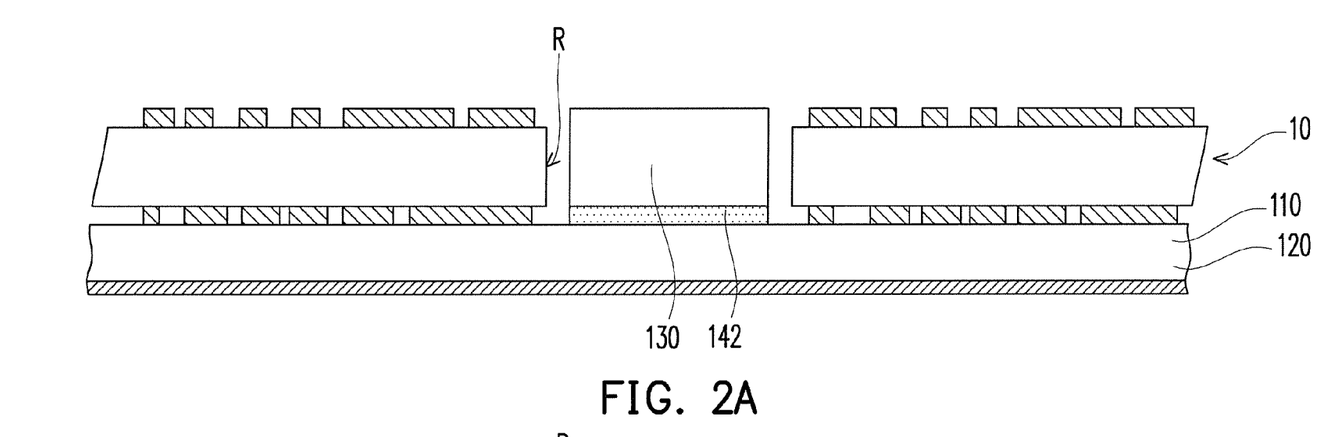
FIGS. 2A and 2B are schematic cross-sectional flowcharts illustrating a process of manufacturing an embedded chip substrate according to another embodiment of the present invention.
Figure 2B:
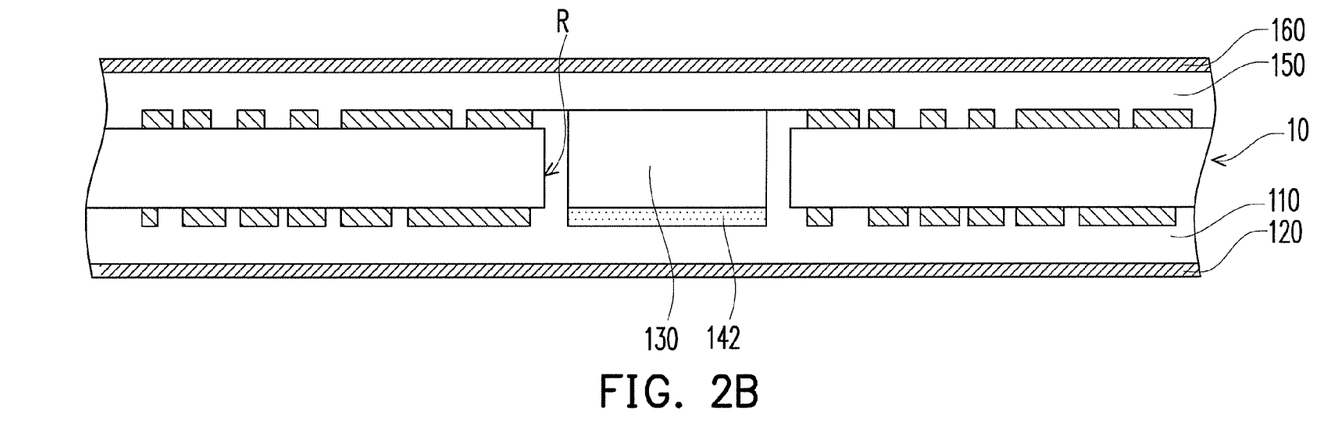
Figure 3:
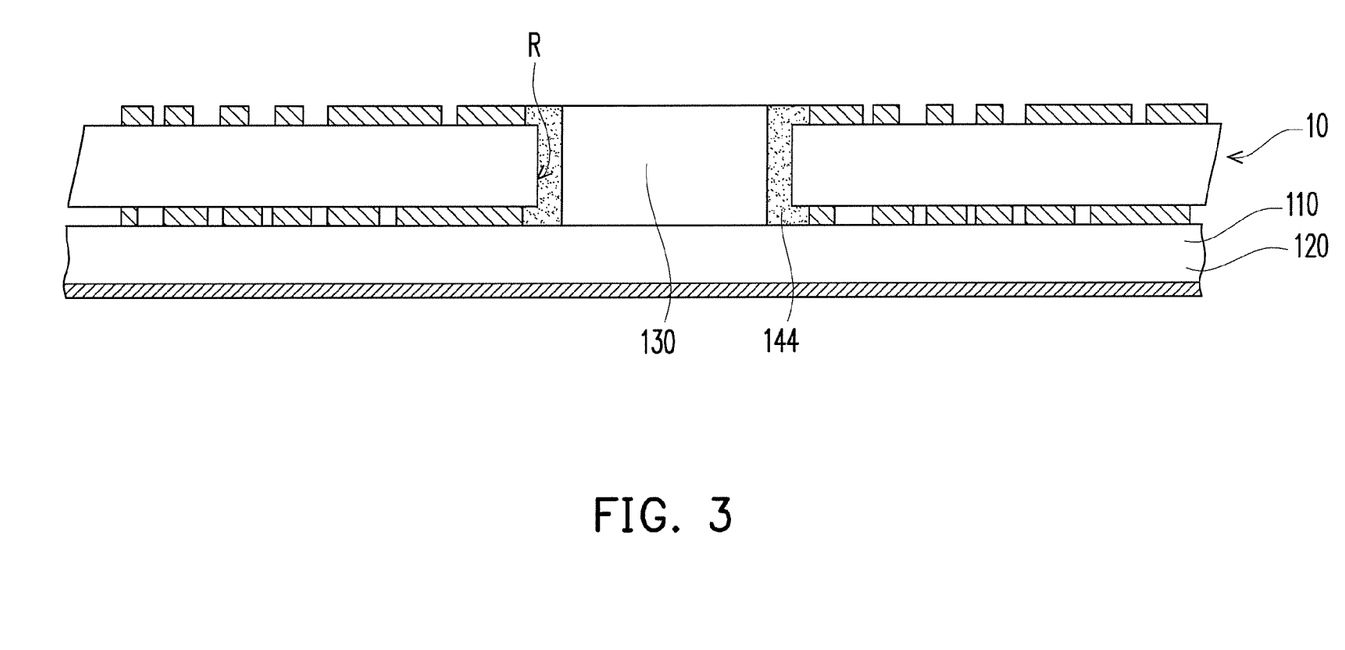
FIG. 3 is a schematic cross-sectional flowchart illustrating a process of manufacturing an embedded chip substrate according to still another embodiment of the present invention.

FIGS. 1A through 1L are schematic cross-sectional flowcharts illustrating a process of manufacturing an embedded chip substrate according to an embodiment of the present invention. FIGS. 2A and 2B are schematic cross-sectional flowcharts illustrating a process of manufacturing an embedded chip substrate according to another embodiment of the present invention. FIG. 3 is a schematic cross-sectional flowchart illustrating a process of manufacturing an embedded chip substrate according to still another embodiment of the present invention.

Figures 1A, 1B:
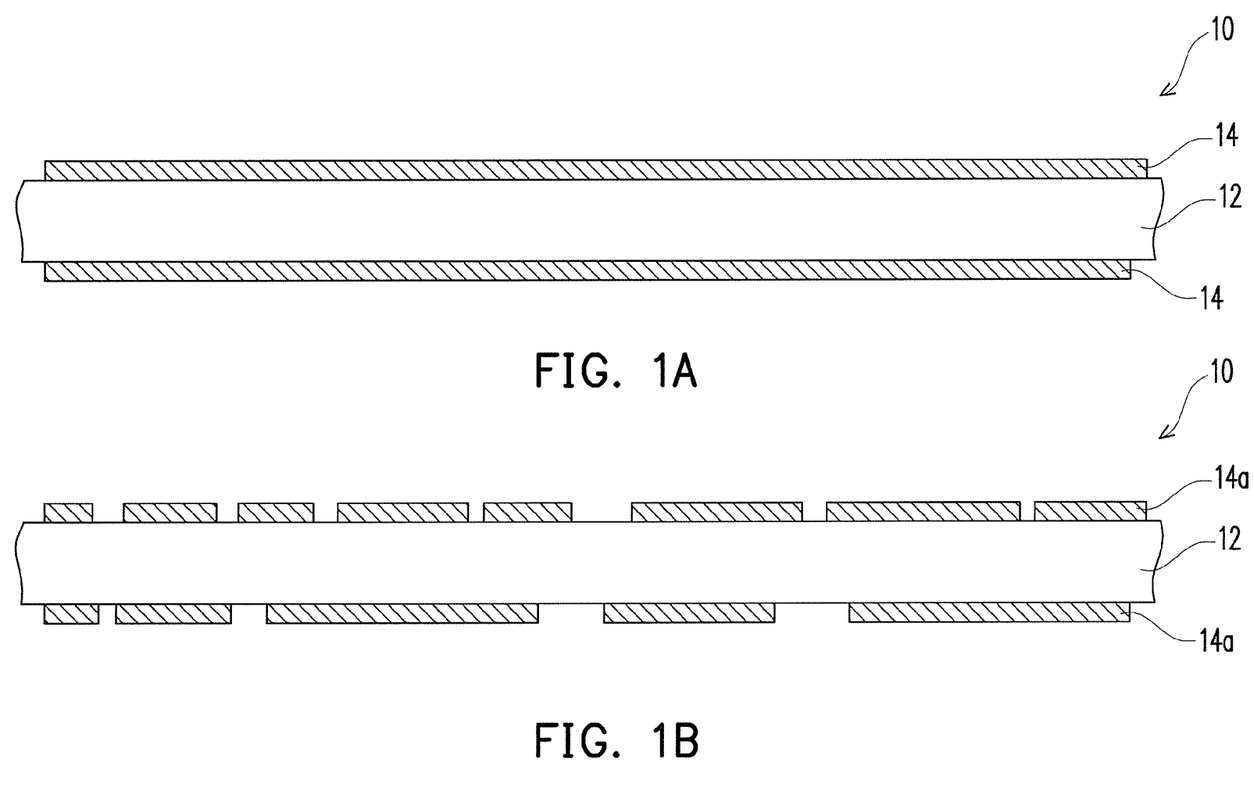
FIGS. 1A through 1L are schematic cross-sectional flowcharts illustrating a process of manufacturing an embedded chip substrate according to an embodiment of the present invention.
Figure 1C:
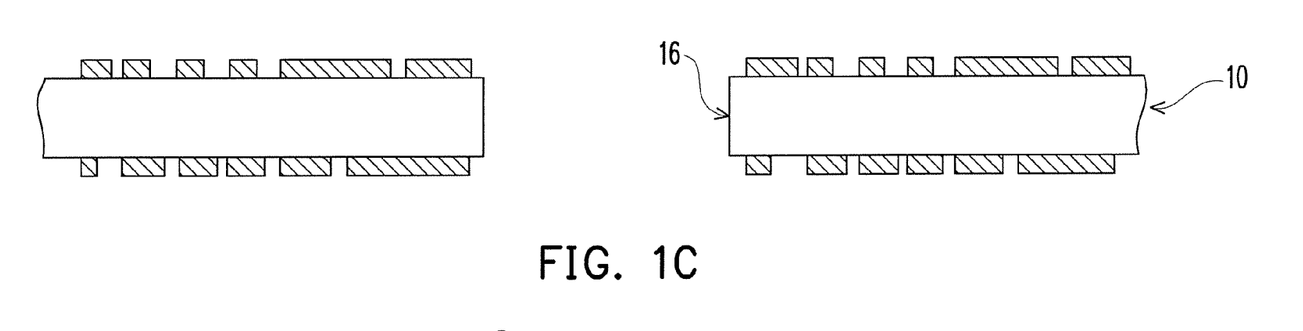

First, referring to FIG. 1A, a core layer 10 is provided. The core layer 10 includes a core dielectric layer 12 and two conductive layers 14 that are disposed at opposite sides of the core dielectric layer 12, respectively. The core dielectric layer 12 can be an insulation board. Additionally, in other embodiments that are not depicted in the drawings, a multi-layered board can serve as a substitute for the core dielectric layer 12 of the present embodiment. The multi-layered board can be composed of multiple circuit layers and multiple insulation layers alternately arranged.

Next, referring to FIG. 1B, the two conductive layers 14 are patterned, respectively, so as to form two core circuit layers 14a. After that, referring to FIG. 1C, an opening 16 is formed on the core layer 10. Here, a method of forming the opening 16 includes performing a routing process, such as a mechanical drilling process, a punching process, or any other appropriate routing processes.

Figure 1D:
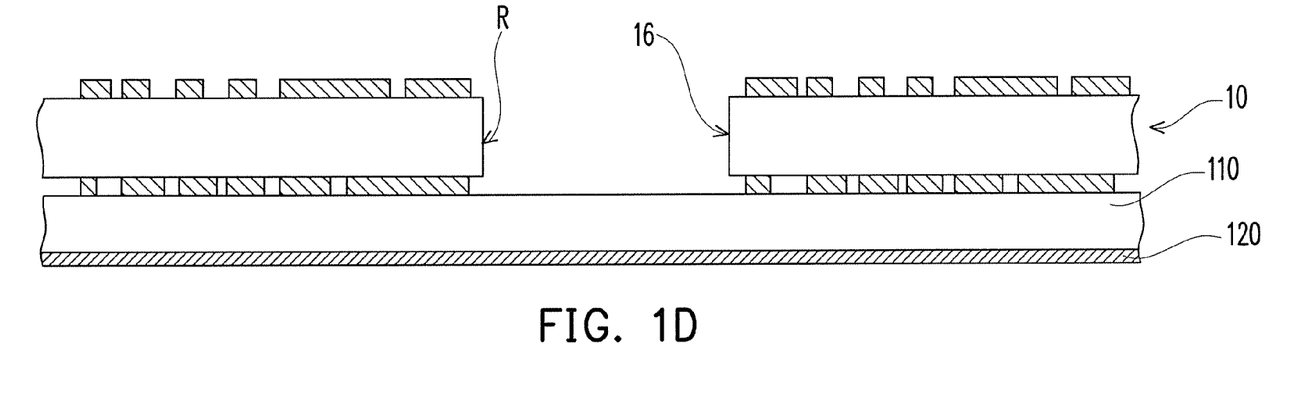

Thereafter, referring to FIG. 1D, a first insulation layer 110 and a first conductive layer 120 are provided. The first conductive layer 120 is disposed on the first insulation layer 110, and a material of the first insulation layer 110 is, for example, a two-state curable compound. In the present embodiment, a resin coated copper (RCC) can be used to form the first insulation layer 110 and the first conductive layer 120. After that, the core layer 10 is disposed on the first insulation layer 110, and the first insulation layer 110 is located between the core layer 10 and the first conductive layer 120. Besides, the opening 16 and the first insulation layer 110 together form a recess R.

Figure 1E:
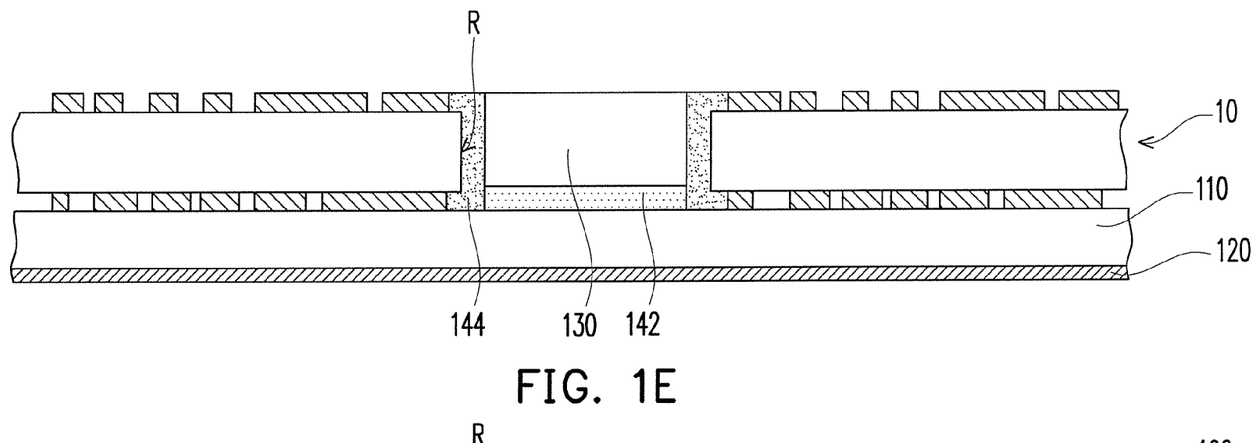

Afterwards, referring to FIG. 1E, a chip 130 is adhered into the recess R. In the present embodiment, the chip 130 is adhered into the recess R by disposing a bottom adhesion layer 142 on the first insulation layer 110, so as to adhere the chip 130 onto the first insulation layer 110. Additionally, a side wall adhesion layer 144 is formed between the inner side wall of the recess R and the side wall of the chip 130, so as to adhere the chip 130 to the inner side wall of the recess R. Besides, in other embodiments, the chip 130 can also be adhered into the recess R only by means of the bottom adhesion layer 142 (as shown in FIG. 2A) or the side wall adhesion layer 144 (as shown in FIG. 3).

A material of the bottom adhesion layer 142 is, for example, polyimide (PI), or any other appropriate adhesive materials. By contrast, a material of the side wall adhesion layer 144 is, for example, epoxy resin, or any other appropriate adhesive materials.

Figure 1F:
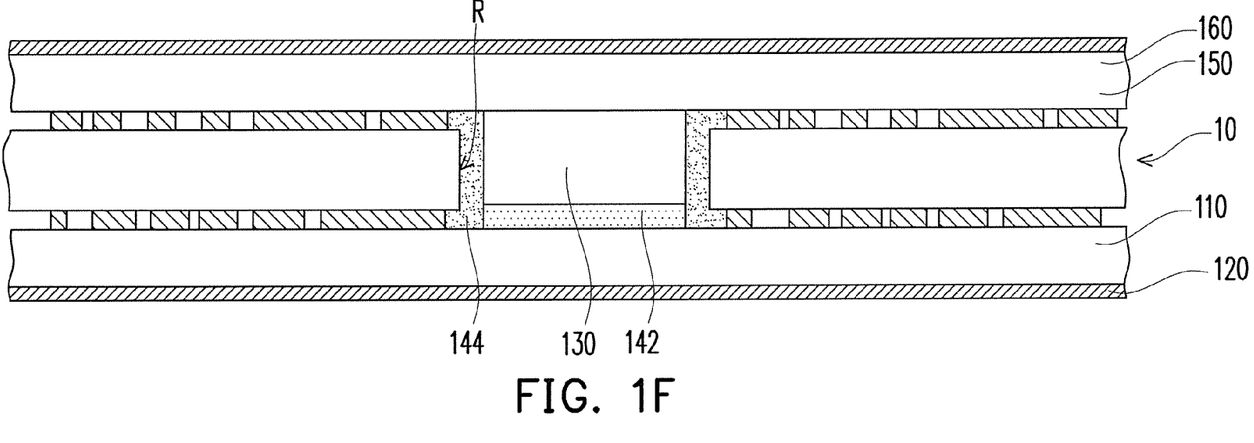

Next, referring to FIG. 1F, a second insulation layer 150 and a second conductive layer 160 are provided. The second conductive layer 160 is disposed on the second insulation layer 150. In the present embodiment, the RCC can be used to form the second insulation layer 150 and the second conductive layer 160. The second insulation layer 150 is then disposed on the core layer 10. Here, the second insulation layer 150 is located between the core layer 10 and the second conductive layer 160 and covers the recess R.

Figure 1G:
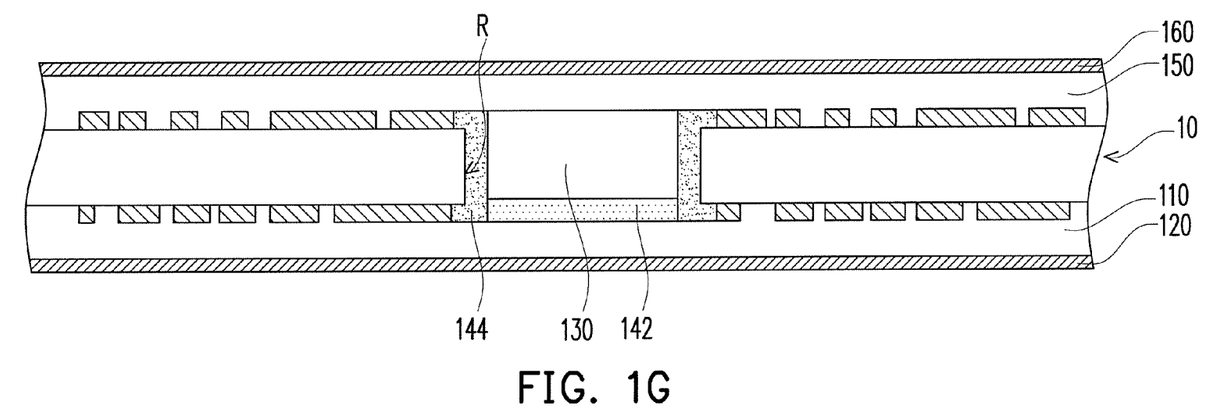

After that, referring to FIG. 1G, the first conductive layer 120, the first insulation layer 110, the core layer 10, the second insulation layer 150, and the second conductive layer 160 are laminated. Besides, the first insulation layer 110 can be heated during the lamination. Since the first insulation layer 110 can be made of the two-stage curable compound, a portion of the first insulation layer 110 overflows between the side wall of the chip 130 and the inner side wall of the recess R.

Thereby, no air or moisture would exist between the side wall of the chip 130 and the inner side wall of the recess R, such that an occurrence of a popcorn effect can be avoided. Moreover, a material of the second insulation layer 150 can also include the two-stage curable compound, which is conducive to filling up the space between the side wall of the chip 130 and the inner side wall of the recess R.

According to other embodiments, when the chip 130 is adhered into the recess R only by means of the bottom adhesion layer 142 (as shown in FIG. 2A), the lamination of the first conductive layer 120, the first insulation layer 110, the core layer 10, the second insulation layer 150, and the second conductive layer 160 and the heating of the first insulation layer 110 allow the space between the side wall of the chip 130 and the inner side wall of the recess R to be filled with a portion of the first insulation layer 110 (as shown in FIG. 2B). As such, it is not necessary to fill the space between the side wall of the chip 130 and the inner side wall of the recess R with other fillers for preventing the occurrence of the popcorn effect.

Figure 1H:
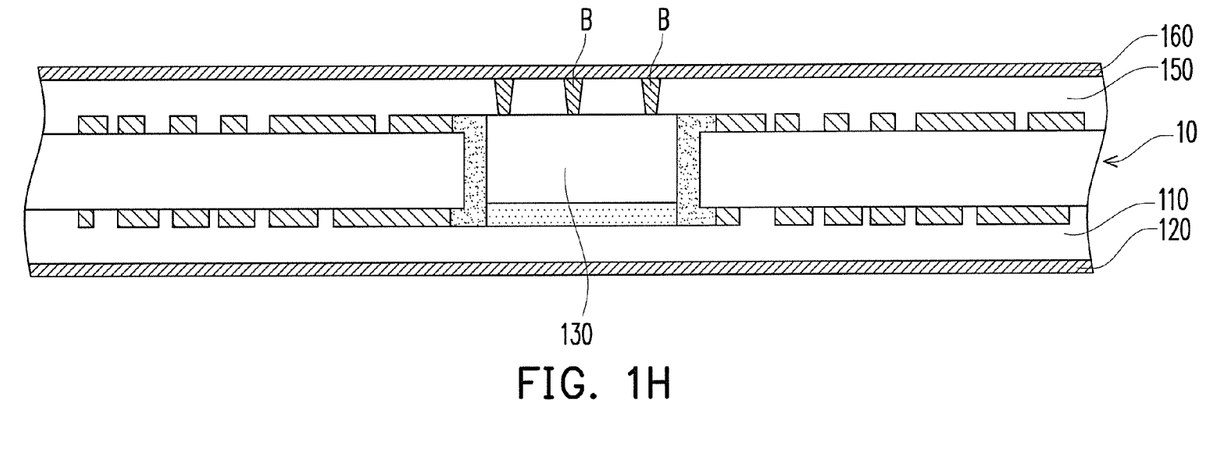
Figure 1I:
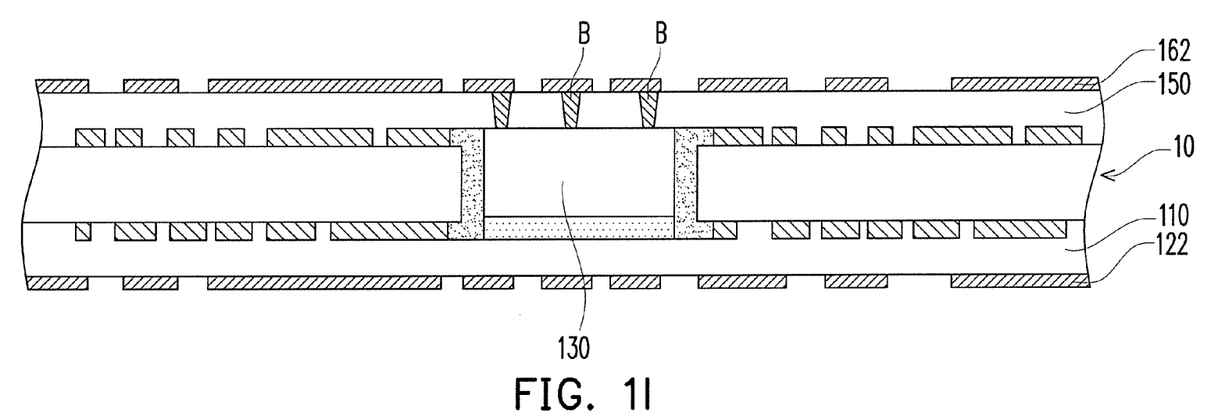

After that, referring to FIG. 1H, a plurality of conductive blind vias B penetrating the second insulation layer 150 are formed in the present embodiment, so as to electrically connect the chip 130 to the second conductive layer 160. Next, referring to FIG. 1I, the first conductive layer 120 and the second conductive layer 160 are respectively patterned, so as to form a first circuit layer 122 and a second circuit layer 162.

Figure 1J:
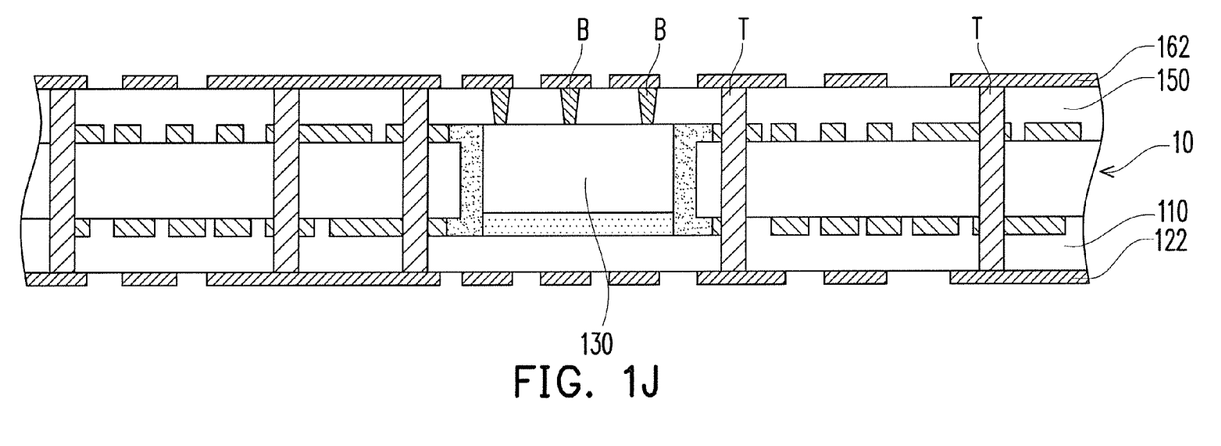

Referring to FIG. 1J, a plurality of conductive through holes T penetrating the second insulation layer 150, the core layer 10, and the first insulation layer 110 are then formed in the present embodiment, so as to electrically connect the first circuit layer 122 to the second circuit layer 162.

Figure 1K:
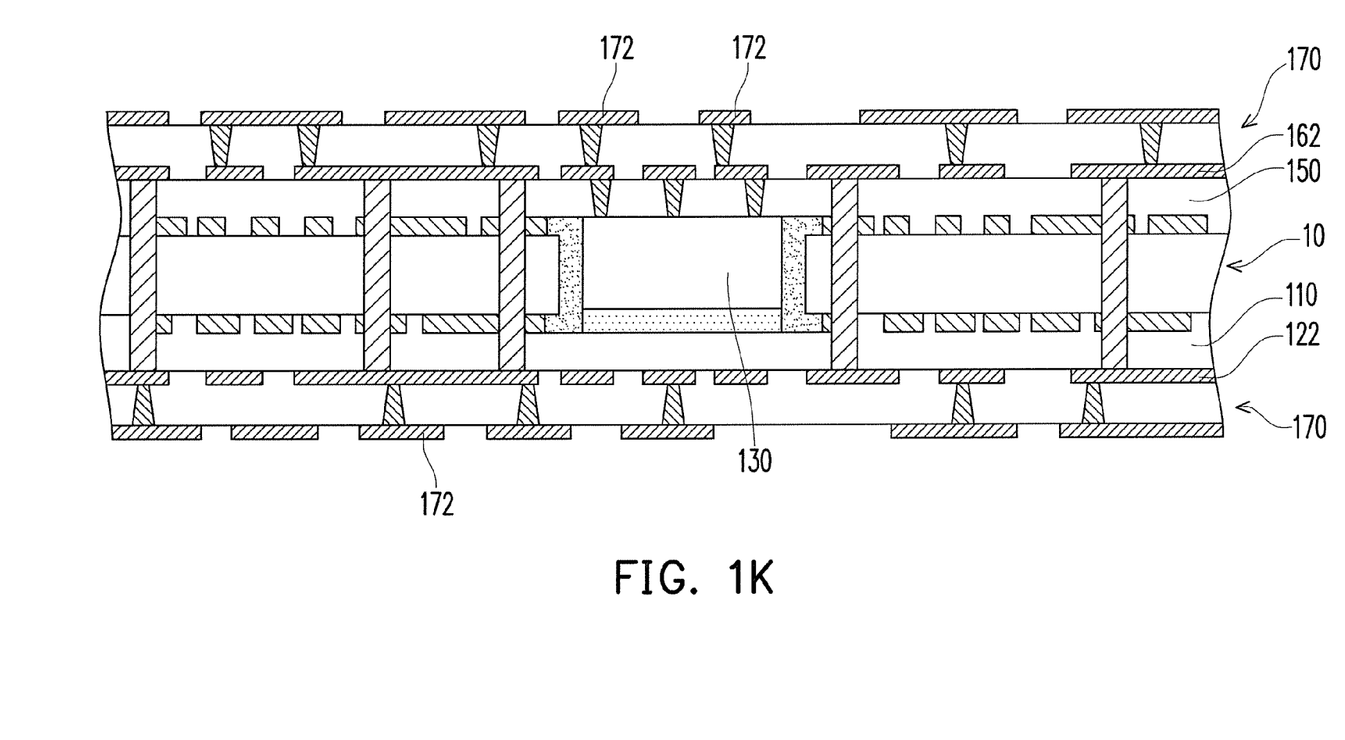

Thereafter, referring to FIG. 1K, in the present embodiment, a build-up structure 170 can be further formed at the outer side of the first insulation layer 110 and the outer side of the second insulation layer 150, respectively. A plurality of solder pads 172 are respectively disposed at the outer sides of the build-up structures 170. Next, referring to FIG. 1L, a solder mask layer 180 is formed on the build-up structures 170, respectively, so as to expose the corresponding solder pads 172. To avoid the surfaces of the solder pads 172 from being oxidized, an electrical connection layer 190 can then be formed on the solder pads 172. Here, the electrical connection layer 190 is, for example, a Ni/Au composite layer.

Figure 1L:
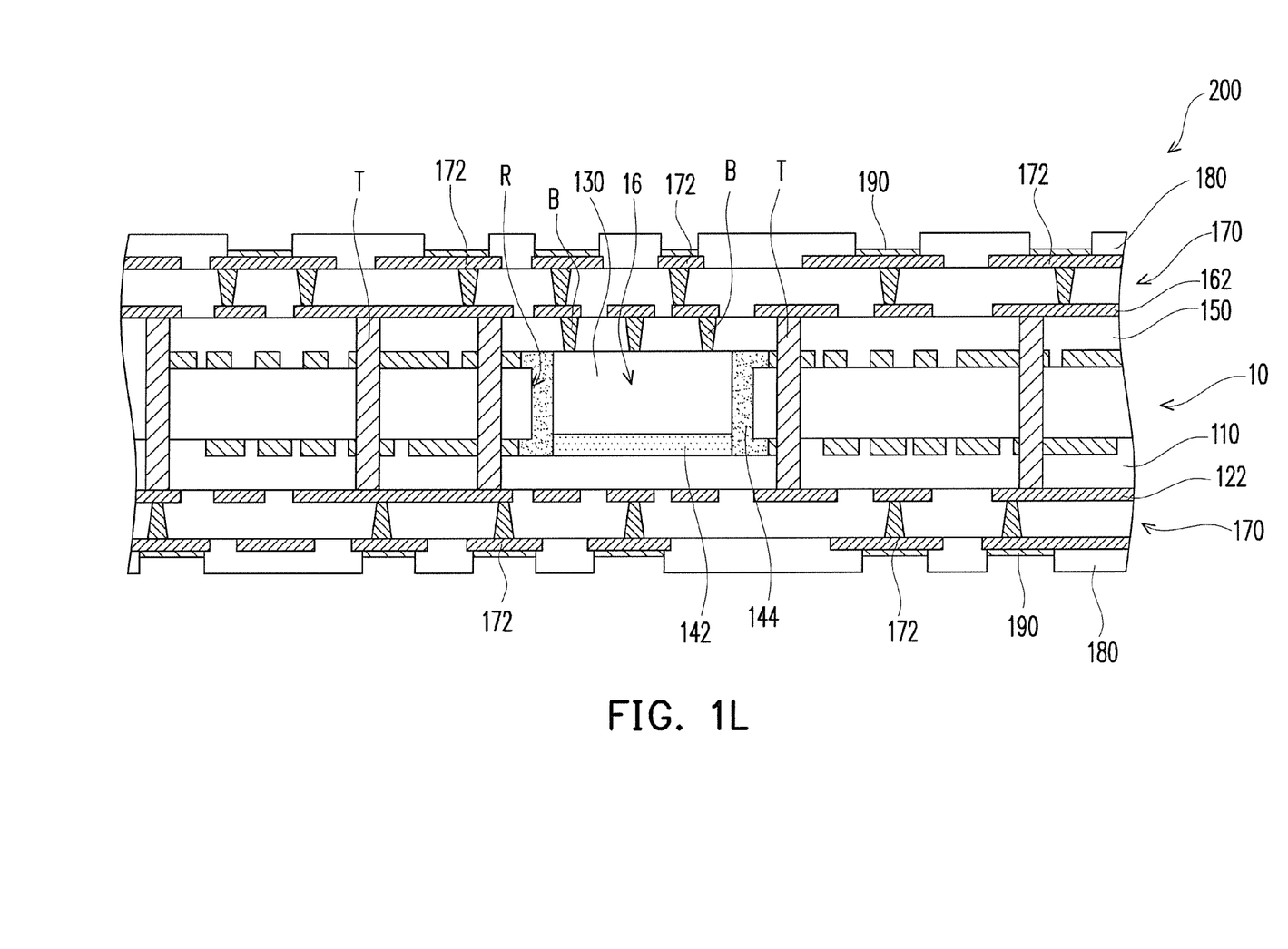

The structure of the embedded chip substrate in FIG. 1L is elaborated hereinafter.

Figure 4:
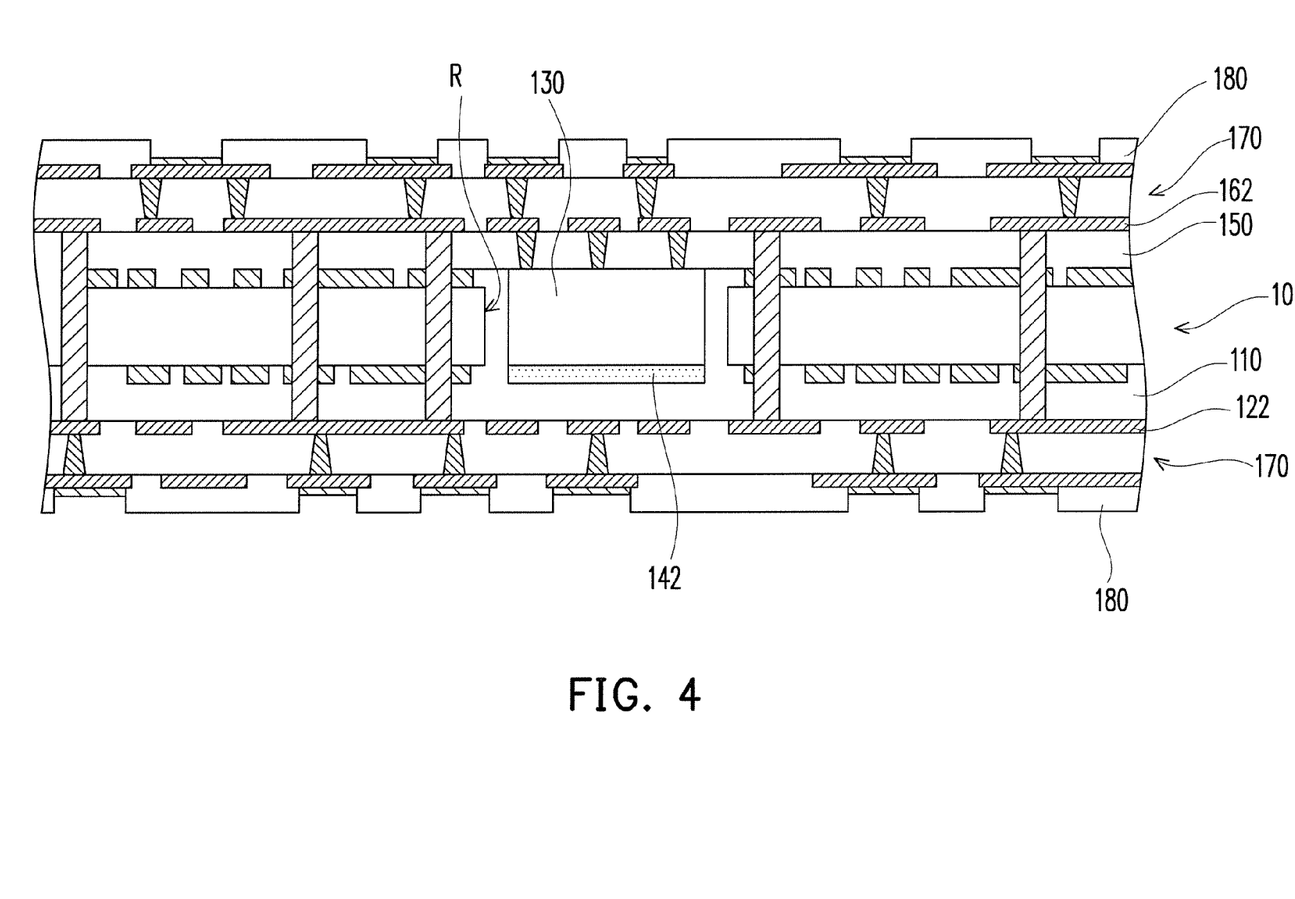
FIGS. 4 and 5 are schematic cross-sectional views illustrating two modifications of the embedded chip substrate depicted in FIG. 1L.
Figure 5:
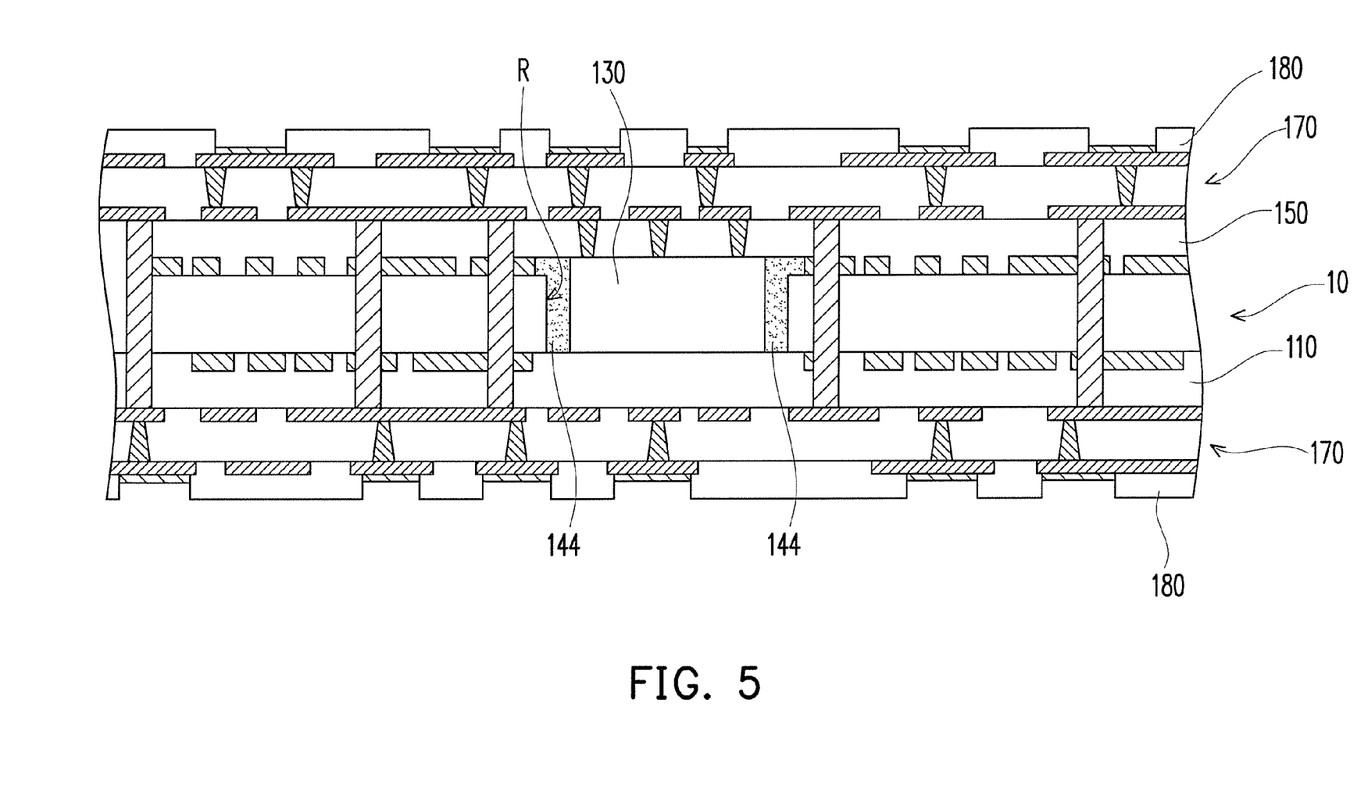

FIGS. 4 and 5 are schematic cross-sectional views illustrating two modifications of the embedded chip substrate depicted in FIG. 1L.

As shown in FIG. 1L, an embedded chip substrate 200 of the present embodiment includes a first insulation layer 110, a core layer 10, a chip 130, a second insulation layer 150, a first circuit layer 122, and a second circuit layer 162. The first insulation layer 110 is made of a two-stage curable compound, for example.

The core layer 10 is disposed on the first insulation layer 110 and has an opening 16 that exposes a portion of the first insulation layer 110. The opening 16 and the first insulation layer 110 together form a recess R where the chip 130 is adhered. In the present embodiment, a bottom adhesion layer 142 is disposed between the chip 130 and the first insulation layer 110, and a side wall adhesion layer 144 is disposed between the inner side wall of the recess R and the side wall of the chip 130, so as to adhere the chip 130 into the recess R.

Besides, referring to FIG. 4, in other embodiments, the chip 130 can be adhered into the recess R only by means of the bottom adhesion layer 142. Note that the first insulation layer 110 can be extended into the space between the inner side wall of the recess R and the side wall of the chip 130, and therefore it is not necessary to fill the space with other fillers for preventing the occurrence of the popcorn effect. Moreover, the material of the second insulation layer 150 can also include the two-stage curable compound, and thus the second insulation layer 150 can also be extended into the space between the inner side wall of the recess R and the side wall of the chip 130 (not shown). Besides, referring to FIG. 5, in other embodiments, the chip 130 can be adhered into the recess R only by means of the side wall adhesion layer 144.

As shown in FIG. 1L, the second insulation layer 150 is disposed on the core layer 10 for covering the chip 130. In addition, the material of the second insulation layer 150 can include the two-stage curable compound. The first circuit layer 122 is disposed at the outer side of the first insulation layer 110, and the first insulation layer 110 is located between the first circuit layer 122 and the core layer 10. The second circuit layer 162 is disposed at the outer side of the second insulation layer 150, and the second insulation layer 150 is located between the second circuit layer 162 and the core layer 10.

In the present embodiment, the first circuit layer 122 and the second circuit layer 162 can be electrically connected to each other through a plurality of conductive through holes T penetrating the second insulation layer 150, the core layer 10, and the first insulation layer 110. The second circuit layer 162 and the chip 130 can be electrically connected to each other through a plurality of conductive blind vias B penetrating the second insulation layer 150.

Additionally, in the present embodiment, a build-up process can be performed at the outer side of the second insulation layer 150 and the outer side of the first insulation layer 110 based on actual demands. According to the present embodiment, a build-up structure 170 is formed respectively at the outer side of the second insulation layer 150 and the outer side of the first insulation layer 110, and a plurality of solder pads 172 are formed at the outer side of each of the built-up structures 170. Moreover, a solder mask layer 180 is formed respectively at the outer sides of the two build-up structures 170 in the present embodiment, and each of the solder mask layers 180 exposes the corresponding solder pads 172.

To avoid the surfaces of the solder pads 172 from being oxidized, an electrical connection layer 190 can be further formed on each of the solder pads 172. Here, the electrical connection layer 190 is, for example, a Ni/Au composite layer.

Based on the above, the chip is embedded into the circuit board according to the present invention, and therefore the chip does not occupy the carrying area on the circuit board. Further, in the aforesaid embodiments, the first insulation layer can be made of the two-stage curable compound. Thus, when the first conductive layer, the first insulation layer, the core layer, the second insulation layer, and the second conductive layer are laminated, the first insulation layer can be heated, such that the first insulation layer overflows between the side wall of the chip and the inner side wall of the recess. Thereby, no air or moisture would exist between the side wall of the chip and the inner side wall of the recess, so as to prevent the occurrence of the popcorn effect.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method of an embedded chip substrate, the fabrication method comprising:
   providing a core layer that has an opening;
   providing a first insulation layer and a first conductive layer, the first conductive layer being disposed on the first insulation layer;
   disposing the core layer on the first insulation layer, the first insulation layer being located between the core layer and the first conductive layer, the opening and the first insulation layer forming a recess;
   adhering a chip to the first insulation layer via a bottom adhesion layer in the recess;
   providing a second insulation layer and a second conductive layer, the second conductive layer being disposed on the second insulation layer;
   laminating the second insulation layer on the core layer in a manner that the recess is filled by a portion of the first insulation layer; and
   respectively patterning the first conductive layer and the second conductive layer, so as to form a first circuit layer and a second circuit layer, wherein the first circuit layer is electrically connected to the second circuit layer, and the second circuit layer is electrically connected to the chip.

2. The fabrication method of the embedded chip substrate as claimed in claim 1, further comprising:
   forming a plurality of conductive blind vias penetrating the second insulation layer before the first conductive layer is patterned, such that the chip is electrically connected to the second conductive layer.

3. The fabrication method of the embedded chip substrate as claimed in claim 1, further comprising:
   forming a plurality of conductive through holes penetrating the second insulation layer, the core layer, and the first insulation layer after the first conductive layer and the second conductive layer are patterned, such that the first circuit layer is electrically connected to the second circuit layer.

4. The fabrication method of the embedded chip substrate as claimed in claim 1, further comprising:
   heating the first insulation layer in the laminating step such that the first insulation layer overflows between the side wall of the chip and the inner side wall of the recess.

5. The fabrication method of the embedded chip substrate as claimed in claim 1, wherein a method of adhering the chip into the recess comprises:
   disposing the bottom adhesion layer on the first insulation layer that is located in the recess; and
   disposing the chip on the bottom adhesion layer.

6. The fabrication method of the embedded chip substrate as claimed in claim 1, further comprising:
   respectively forming a build-up structure at the outer side of the first insulation layer and the outer side of the second insulation layer, a plurality of solder pads being located at the outer sides of the two build-up structures, respectively.

7. A fabrication method of an embedded chip substrate, the fabrication method comprising:
   providing a core layer that has an opening;
   providing a combination of a first insulation layer and a first conductive layer, wherein the first conductive layer is disposed on the first insulation layer;
   attaching the core layer to the first insulation layer such that the first insulation layer is located between the core layer and the first conductive layer, wherein the opening and the first insulation layer form a recess;
   adhering a chip to the first insulation layer via a bottom adhesion layer in the recess;
   providing a second insulation layer and a second conductive layer, the second conductive layer being disposed on the second insulation layer;
   laminating the second insulation layer on the core layer in a manner that the recess is filled by a portion of the first insulation layer; and
   respectively patterning the first conductive layer and the second conductive layer, so as to form a first circuit layer and a second circuit layer, wherein the first circuit layer is electrically connected to the second circuit layer, and the second circuit layer is electrically connected to the chip.

\* \* \* \* \*